United States Patent
Pril et al.

(10) Patent No.: US 7,348,574 B2
(45) Date of Patent: Mar. 25, 2008

(54) POSITION MEASUREMENT SYSTEM AND LITHOGRAPHIC APPARATUS

(75) Inventors: Wouter Onno Pril, Eindhoven (NL); Emiel Jozef Melanie Eussen, Eindhoven (NL); Engelbertus Antonius Fransiscus Van Der Pasch, Oirschot (NL)

(73) Assignee: ASML Netherlands, B.V., Veldhoven (NL)

( * ) Notice: Subject to any disclaimer, the term of this patent is extended or adjusted under 35 U.S.C. 154(b) by 245 days.

(21) Appl. No.: 11/217,670

(22) Filed: Sep. 2, 2005

(65) Prior Publication Data

US 2007/0051160 A1 Mar. 8, 2007

(51) Int. Cl.
*G21G 5/00* (2006.01)

(52) U.S. Cl. .................... 250/491.1; 356/616; 356/400

(58) Field of Classification Search ..................... None
See application file for complete search history.

(56) References Cited

U.S. PATENT DOCUMENTS

| | | | |
|---|---|---|---|
| 5,523,841 A | 6/1996 | Nara et al. | |
| 5,757,160 A | 5/1998 | Kreuzer | |
| 6,285,444 B1 | 9/2001 | Osanai et al. | |
| 6,495,847 B1 | 12/2002 | Asano et al. | |
| 6,650,399 B2 * | 11/2003 | Baselmans et al. | 355/55 |
| 6,930,760 B2 * | 8/2005 | Van Elp et al. | 355/67 |
| 2005/0024643 A1 * | 2/2005 | Bleeker et al. | 356/400 |
| 2005/0168714 A1 | 8/2005 | Renkens et al. | |

FOREIGN PATENT DOCUMENTS

| | | |
|---|---|---|
| EP | 1 014 199 A2 | 6/2000 |
| EP | 1 041 357 A1 | 10/2000 |

OTHER PUBLICATIONS

European Search Report for European Patent Application No. EP 06 07 6563, dated Dec. 8, 2006.

* cited by examiner

*Primary Examiner*—Jack I. Berman
*Assistant Examiner*—Zia R. Hashmi
(74) *Attorney, Agent, or Firm*—Pillsbury Winthrop Shaw Pittman LLP

(57) ABSTRACT

A position measurement system for measuring a position of an object is described, the system including: a first incremental measurement unit for measuring a first number of first distance steps in a distance between a reference frame and the object, wherein the first number equals a first integer value plus a first fraction, and a second incremental measurement unit for measuring a second number of second distance steps in a distance between the reference frame and the object, wherein the second number equals a second integer value plus a second fraction, wherein the position measurement system is constructed and arranged to initialize the second incremental measurement unit on the basis of the first number and the second fraction.

22 Claims, 8 Drawing Sheets

POSITION MEASUREMENT SYSTEM AND LITHOGRAPHIC APPARATUS

BACKGROUND

1. Field of the Invention

The present invention relates to a position measurement system and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately transfer the pattern onto the target portion of the substrate, the relative position of the pattern and the target portion should be known. Therefore, the lithographic apparatus is in general equipped with one or more measurement systems to determine the position of, e.g., the substrate or the patterning device. Examples of such measurement systems are interferometer systems or encoder systems. Both systems can be designated as incremental systems. Using such a position measurement system, the position of an object can be determined relative to a chosen reference as an integer number of increments (or periods) of a predefined length. Using an interferometer, this increment may, e.g., correspond to a quarter of the wavelength of the interferometer laser. In case of an encoder system, the increment may, e.g., correspond to a quarter of the period of the encoder grating.

In order to improve the resolution of such an incremental measurement system, methods are developed to provide an interpolation within one increment (or period).

Such a position measurement system usually comprises an incremental measurement unit comprising a first part comprising a sensor and a second part co-operating with the sensor of the first part. In case of an interferometer system, the second part may comprise a mirror for reflecting a beam originating from the interferometer laser to the sensor. In case of an encoder system, the second part may comprise a one- or two-dimensional grating co-operating with the sensor (in this case, the sensor usually comprises an encoder head). Because of the limited size of, e.g., the mirror or the grating, the operating range of the measurement system is limited. In order to increase the operating range, the measurement system can be equipped with more that one sensor arranged on different locations along a required operating range ensuring that the position measurement can be performed over the entire required operating range. In such a multi-sensor measurement system, problems may arise during the transition of the position measurement by a first sensor to the position measurement by a second sensor. Conventionally, one (or more) measurement values of the first sensor are used to initialize the second sensor during the transition (such initialization may be required because the initial measurement by the second sensor may not be related to a reference). Because this initialization is based upon measurements of both the first sensor and the second sensor, measurements that may contain a measurement error, this initialization may result in an increased measurement error for the second sensor. During a next transition (either a transition of a measurement by the second sensor to a measurement by a third sensor or a transition of a measurement by the second sensor to a measurement by the first sensor) a further increase in the measurement error may occur. As such, the accuracy of a multi-sensor measurement system used in a conventional way may deteriorate due to transition from a measurement by one sensor to a measurement by another sensor.

SUMMARY

Embodiments of the invention include an improved position measurement system. In embodiments of the invention, the accuracy of the position measurement system is improved during a take over process between two sensors of the measurement system.

According to an embodiment of the invention, there is provided a position measurement system for measuring a position of an object, comprising:
  a first incremental measurement unit for measuring a first number of first distance steps in a distance between a reference frame and the object, wherein the first number equals a first integer value plus a first fraction,
  a second incremental measurement unit for measuring a second number of second distance steps in a distance between the reference frame and the object, wherein the second number equals a second integer value plus a second fraction,
  wherein the position measurement system is constructed and arranged to initialize the second incremental measurement unit on the basis of the first number and the second fraction.

According to a further embodiment of the invention there is provided a lithographic apparatus comprising:
  an illumination system configured to condition a radiation beam;
  a support constructed to support a patterning device, the patterning device being capable of imparting the radiation beam with a pattern in its cross-section to form a patterned radiation beam;
  a substrate table constructed to hold a substrate; and
  a projection system configured to project the patterned radiation beam onto a target portion of the substrate,
  wherein the apparatus further comprises a position measurement system according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
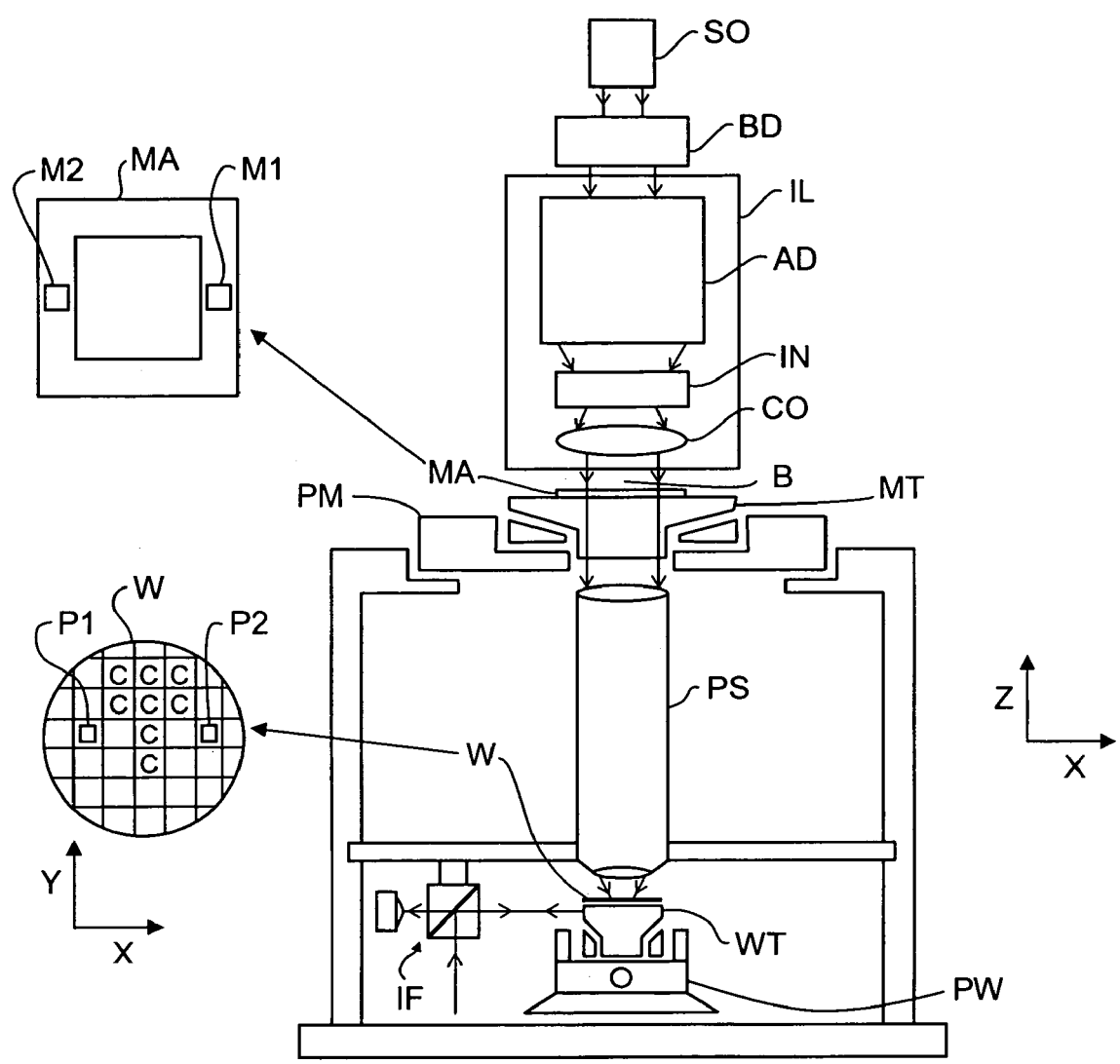
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g., UW radiation or EUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single, dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to project a pattern onto a predefined target portion of the substrate, the lithographic apparatus requires an accurate measurement system for determining the position of the substrate table and the patterning device. Interferometer systems and encoder systems are found to be suitable for accurately determining the position of an object (e.g., a substrate table or a mask table). Both measurement systems can be designated as incremental position measurement systems. In both systems, the position of an object can be determined relative to a chosen reference as an integer number of distance steps (or periods or increments) of a predefined length. Within one increment or distance step, the position can be determined by means of interpolation in order to improve the resolution of the measurement. As such, an output signal $X_{out}$ of the position measurement system, representing the position of an object (e.g., an X-position) can be described by the following equation (1):

$$X_{out}=IC+(N+\phi+\epsilon)\cdot p \tag{1}$$

wherein
p=distance step of the measurement system
IC=initialization constant
N=integer number representing a number of distance steps p
$\phi$=fraction between 0 and 1
$\epsilon$=measurement error.

Fraction $\phi$ in equation (1) is also referred to as the phase of the position measurement.

In general, an incremental position measurement comprises an incremental measurement unit comprising a first part comprising a sensor and a second part co-operating with the sensor of the first part. In case of an interferometer system, the second part may comprise a reflective surface (e.g., a mirror) for reflecting a beam originating from the interferometer laser to the sensor. In case of an encoder system, the second part may comprise a one- or two-dimensional grating co-operating with the sensor. Either the first part or the second part can be mounted to the object of which the position is to be determined (as an example, the object may be an object table for holding a substrate or a patterning device of a lithographic apparatus).

In general, an incremental position measurement system does not provide an absolute position measurement but provides information about a distance traveled between a first position and a second, by counting the number of distance steps p that are detected during the displacement from the first position to the second and by an interpolation within one period. Therefore, in order to provide an output signal $X_{out}$ representing the position of an object, e.g., relative to a reference or in order to define a reference position such as a zero reference, a calibration may be required. As an example, starting from a known position of the object (e.g., a position relative to a frame), the initialization constant IC can be set during a calibration sequence such that the output signal of the measurement system correspond to that known position. Alternatively, the initialization constant IC may also be used to define a zero reference for the measurements. It should also be noted that the calibration may be based on another position measurement.

Figure 2A:
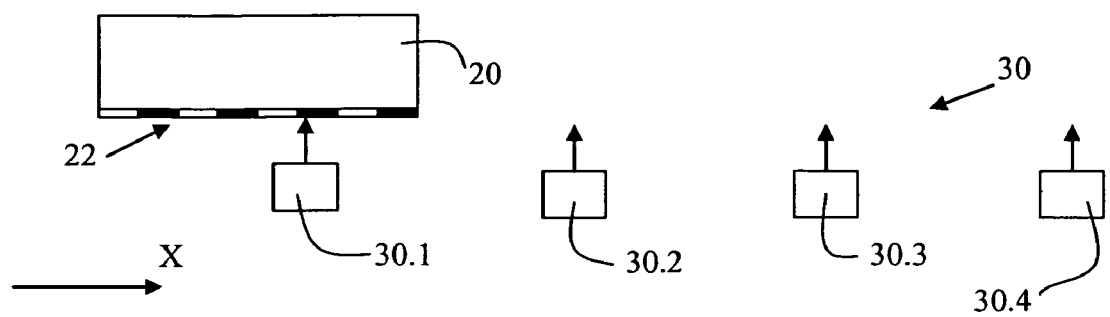
FIGS. 2a and 2b schematically depict a multi-sensor incremental position measurement system.
Figure 2B:
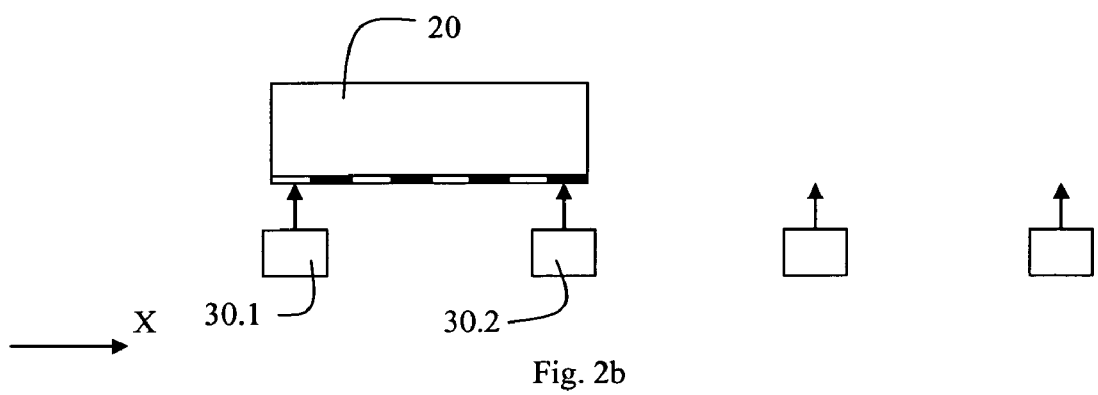

The measurement range of the position measurement system is, in general, limited by the size of the second part, i.e., the reflective surface in case of an interferometer system or the grating in case of an encoder system. In case the operating range of the object of which the position is to be determined is larger that the measurement range, one can opt to increase the size of the second part (e.g., increase the length of the reflective surface or the grating) or one can choose to position multiple sensors along the required operating range. The latter is illustrated in FIG. 2a. FIG. 2a schematically depicts a measurement setup for measuring the X-position of an object 20 provided with a linear grating 22. As an example, the object may be a mask table of a lithographic apparatus. The linear grating 22 is schematically depicted as an array of black and white squares representing the periodicity of the grating with a period p. The measurement setup further comprises an array of sensors 30 (comprising sensors 30.1, 30.2, 30.3 and 30.4) arranged to co-operate with the grating 22. In order to perform a measurement, the optical sensor should be able to see the grating 22. As such, it will be clear that the range of X-positions that allow a position measurement of the object is determined by the length of the grating in the X-direction and therefore would be limited to the length of the grating in the X-direction incase only one sensor would be applied. By a proper arrangement of an array of sensors, the position measurement by a first sensor can be taken over by a neighboring second sensor when the first sensor reaches the end of its measurement range. FIG. 2b schematically an X-position of the object 20 wherein the grating is in front of two sensors 30.1 and 30.2 (it is assumed that the output signal of sensor 30.1 represents the position of the object). In such a position, both sensors could be used to provide a signal representing the position of the object. However, as discussed, the signal generated by sensor 30.2 initially does not represent the position of the object; an initialization is required. This initialization may result in sensor 30.2 providing a signal representing the position of the object such that sensor 30.2 may take over the position measurement of sensor 30.1.

Figure 3A:
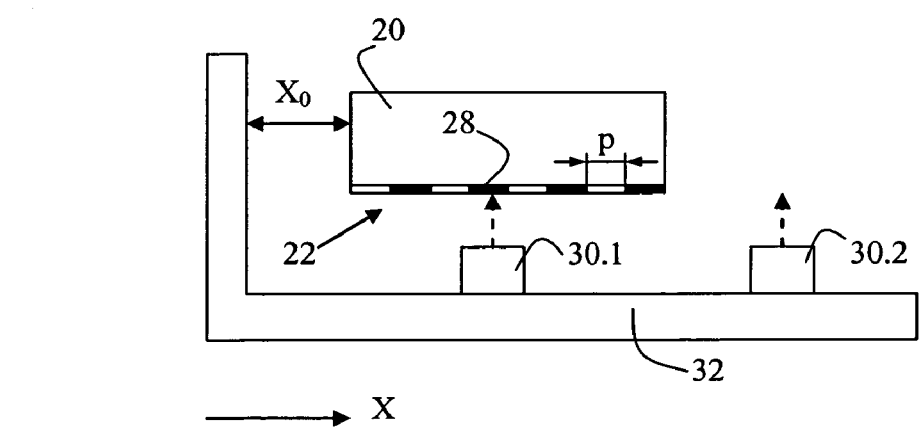
FIGS. 3a-3c schematically depict a take over process in an incremental position measurement system.
Figure 3B:
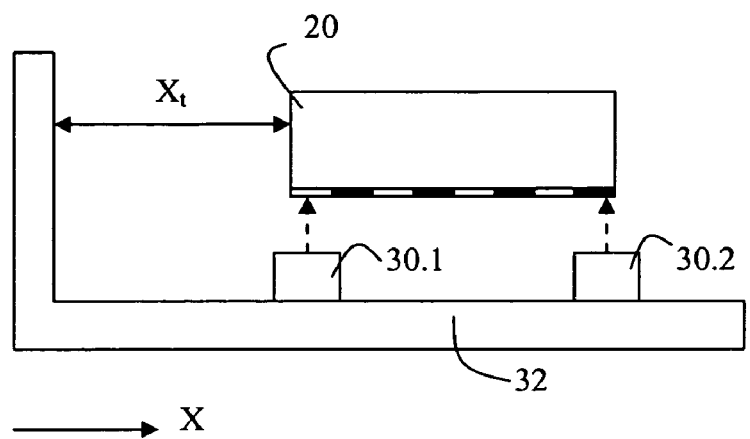
Figure 3C:
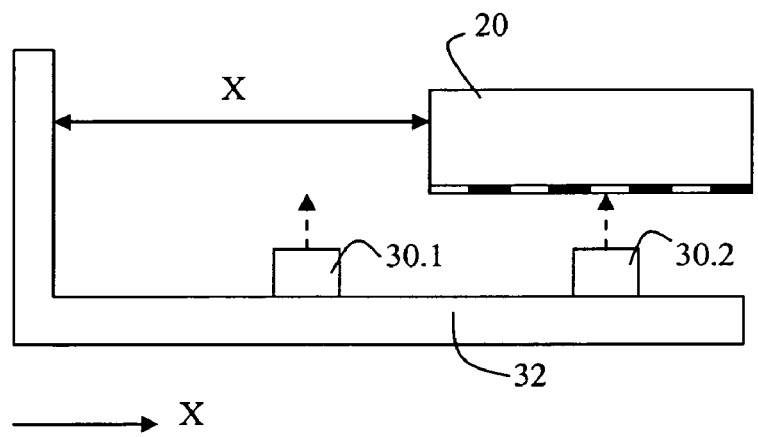

FIGS. 3a, 3b and 3c schematically illustrate the take over process from one sensor to another in a more detailed manner. FIG. 3a schematically depicts an initial position of an object 20 provided with a grating 22 having a period p. It is further assumed that the X-position of the object relative to a reference frame 32 is known in the initial position ($X_0$) as depicted. This position reference ($X_0$) can be applied to calibrate the measurement system such that the output signal of the sensor 30.1 substantially equals $X_0$ in the initial position.

This can be achieved as follows: When the measurement system is brought online in the initial position, the sensor 30.1 may produce an output signal $X1_{out\_0}$, prior to initialization $$X1_{out\_0} = IC_0 + (N_{10}\phi_{10} + \epsilon) \cdot p \quad (2)$$

Equation (2) comprises an initialization constant $IC_0$. Initially, the initialization constant may have an arbitrary value or can be set equal to zero. Initially, $N_{10}$, representing the number of periods traveled between two positions, can be set to zero or may have any arbitrary value. $\phi_{10}$ represents the phase determined by the measurement system in the initial position. Referring to FIG. 3a, $\phi_{10}$ may correspond to a fraction of period 28. $\epsilon \cdot p$ represents the error of the actual measurement. It should be noted that the measurement error is a stochastic variable that can be characterized by a standard deviation $\sigma_\epsilon$. As such, the subtraction of two signals comprising the error may, in general, not result in a cancellation of the error because the errors of both signals can be considered to be independent. Rather, the standard deviation (defined by its probability distribution) of the result of the subtraction yields in a larger standard deviation than $\sigma_\epsilon$. The addition (or subtraction) of two independent signals having a standard deviation a and b results in a signal having a standard deviation equal to a $\sqrt{a^2+b^2}$.

In order to provide an output signal corresponding to $X_0$, a value $IC_a$ can be added to the initial value of the initialization constant $IC_0$:

$$IC_a = X_0 - X1_{out\_i} \quad (3)$$

By doing so, the output signal corresponds to $X_0$. Once the measurement system is calibrated, a measurement of the X-position within the measurement range of the sensor 30.1 can be performed. In case the object 20 is to be displaced beyond the measurement range of the sensor 30.1, a take over of the position measurement by sensor 30.2 may be required. Such a take over can be performed in a position as schematically indicated in FIG. 3b.

Designating the X-position by $X_t$ in the position as indicated, the output signal of sensor 30.1 in this position ($X1_{out\_t}$) can be described as:

$$X1_{out\_t} = IC_0 + (N_{1t} + \phi_{1t} + \epsilon) \cdot p = X_t \quad (4)$$

$IC_0$ in equation (4) represents the initialization constant of the sensor 30.1 after calibration.

When sensor 30.2 is brought online in the position as depicted in FIG. 3b, it may generate an output signal $X2_{out\_t}$, prior to initialization:

$$X2_{out\_t} = IC_2 + (N_{2t} + \phi_{2t} + \epsilon) \cdot p \quad (5)$$

As indicated, the output signal comprises an initialization constant $IC_2$ initially having an arbitrary value prior to the initialization. Also $N_{2t}$ may initially have an arbitrary value. In general, $X2_{out\_t}$, shall not correspond to $X_t$, because no initialization has been done yet. In order to obtain this correspondence (i.e., a correspondence between the output signal of sensor 30.2 and the X-position $X_t$), an initialization constant $IC_a$ can be added to the initial value of the initialization constant $IC_2$:

$$IC_a = X_t - X2_{out\_t} \quad (6)$$

Once initialized, the position measurement can be obtained from the output signal of sensor 30.2. As such, a take over process between sensor 30.1 and sensor 30.2 can be established. As a result, a position measurement of the object 20 may be performed by sensor 30.2 in a position as indicated in FIG. 3c, i.e., a position wherein sensor 30.1 can no longer perform the position measurement thereby increasing the operating range of the object.

The process as described in FIGS. 3a to 3c can be summarized as follows:

At first, a first measurement sensor is calibrated based upon, e.g., a reference position. In order to take over the position measurement from the first sensor, a second sensor is initialized using the output signal from the first sensor in a position wherein both sensors are able to perform a position measurement.

When the object 20 is in a position as depicted in FIG. 3c, it may be required to reposition it again to a position wherein the position can only be measured using sensor 30.1.

Conventionally, such a take over from a position measurement using sensor 30.2 back to a position measurement using sensor 30.1 is done in a similar manner as the take over from a position measurement using sensor 30.1 to a position measurement using sensor 30.2, i.e., in order to take over the position measurement from the sensor 30.2, sensor 30.1 is initialized using the output signal from the sensor 30.2 in a position wherein both sensors are able to perform a position measurement.

It should be noted that such an approach may have an important impact on the positional accuracy of the measurement. This can be illustrated as follows:

Assuming a first sensor arranged to measure the position of an object, the sensor being initialized in a reference position as described above. The output signal of the sensor can in general be described by equation (1) and contains a certain measurement error $\epsilon \cdot p$ (note that the measurement error may also be described as a separate error rather than as a fraction of the period p). Because the initialization constant IC (see eq. (3)) is based upon a measurement, this constant also comprises a measurement error $\epsilon \cdot p$. (It is assumed that the measurement error $\epsilon \cdot p$ made by a sensor on different positions or by different sensors in an array of sensors is substantially equal for all measurements and that those errors are independent of each other).

As a result, a position measurement with the first sensor at an arbitrary position after initialization may have a measurement error that is larger than $\epsilon \cdot p$ because the initialization constant is subject to a measurement error $\epsilon \cdot p$ and the actual measurement is subject to a measurement error $\epsilon \cdot p$. Characterizing the error of the measurements by the standard deviation $\sigma_\epsilon$, the standard deviation of the position measurement of the first sensor substantially equals $\sigma_\epsilon \cdot \sqrt{2}$ (because the addition (or subtraction) of two signals which are independent and having a standard deviation a and b results in a standard deviation equal to $\sqrt{a^2+b^2}$).

During the take over process of the position measurement by a second sensor, the second sensor is initialized using the position measurement of the first sensor. The initialization constant of the second sensor can be determined according to equation (6). The initialization constant according to equation (6) is a function of the measurement of the first sensor (having an standard deviation of $\sigma_\epsilon \cdot \sqrt{2}$) and the initial measurement of the second sensor (having a standard deviation $\sigma_\epsilon$). As a result, the initialization constant of the second sensor may have a standard deviation equal to $\sigma_\epsilon \cdot \sqrt{3}$. As a result, a position measurement with the second sensor at an arbitrary position after initialization may result in a further increase in the measurement error because of the initialization that is subject to a standard deviation of $\sigma_\epsilon \cdot \sqrt{3}$ and because of the actual measurement that is subject to an standard deviation of $\sigma_\epsilon$. In case both errors are independent, the standard deviation of the output signal of the second sensor equals $\sigma_\epsilon \cdot \sqrt{4}$.

In case the same procedure is repeated during a subsequent take over take over from a position measurement using the second sensor back to a position measurement using the first sensor, the standard deviation of the first sensor may have increased to $\sigma_\epsilon \cdot \sqrt{6}$. As can be seen, in case a larger number of take over processes are to be expected, the take over process may cause a built up of take over errors and may result in significant reduction in the accuracy of the measurement.

It should be noted that the built up of take over errors can be mitigated to some extend by calculating the initialization constant on the basis of an average of multiple measurement samples. However, in order for this method to be effective, the averaging should be performed over a comparatively large period in time because in general, the dominant part in the measurement error $\epsilon \cdot p$ may be low frequent. As an example, the frequency spectrum may comprise an important so-called 1/f component implying that the size of the error in the frequency domain is proportional to one over the frequency f. Significantly reducing the take over error by averaging would require sampling over several tenth of a second. In most cases this would cause an unacceptable throughput penalty.

In the measurement system according to the present invention, a different approach is adopted during the take over process in order to reduce or mitigate the built up of take over errors.

Figure 4A:
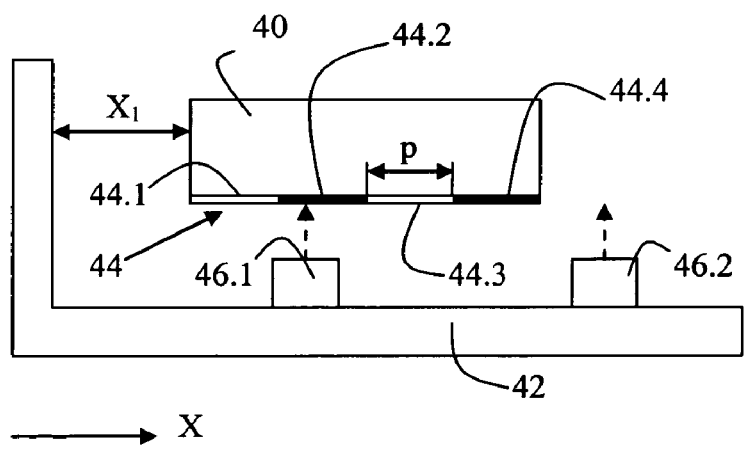
FIGS. 4a-4c schematically depict a take over process according to the present invention.

The approach adopted in the present invention uses the insight that the measurement systems as described can be considered deterministic with respect to the measured phase $\phi$: a repeated object position, measured with a specific sensor, will result in the same phase $\phi$ or, the measured phase $\phi$ can be considered to represent an absolute position within one period p (apart from the measurement error). In case the relative position between different sensors of an array of sensors remains substantially constant, one can easily acknowledge that the difference between the measured phase of one sensor and the measured phase of an other sensor also remains substantially constant in a repeated object position. This can be illustrated as follows:

FIG. 4a schematically depicts an object 40, a grating 44 mounted to the object (the grating is represented as an array of alternating black and white squares (44.1, 44.2, 44.3 and 44.4) having a period p). FIG. 4a further depicts two sensors 46.1 and 46.2 mounted on a reference frame 42 and arranged to co-operate with the grating 44 for measuring the X-position of the object. Assuming that sensor 46.1 has been initialized (e.g., by equating the sensor output signal to a predefined value in a reference position), the position of the object 40 (i.e., the X-position $X_1$) can be obtained from output signal of sensor 46.1.

Figure 4B:
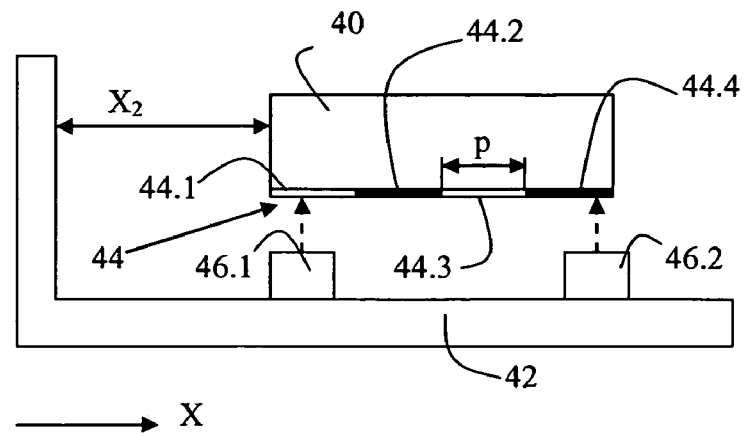

When the object 40 is displaced to a position as depicted in FIG. 4b (X-position equal to $X_2$), sensor 46.1 may provide an output signal representing the X-position of the object, the output signal can be characterized by an initialization constant $IC_1$, an integer number $N_1$ representing a number of distance steps (or increments) traveled from the reference position and a phase $\phi_1$ (describing the position within the period of the actual position, i.e., the period with reference number 44.1. In order for sensor 46.2 to take over the position measurement of sensor 46.1, an initialization can be performed based on the difference between the output signal of sensor 46.1 (representing the X-position $X_2$) and the output signal of sensor 46.2. When sensor 46.2 is brought online, it may generate an arbitrary output signal $X_a$ that, in general, can be described as:

$$X_a = IC_2 + (N_2 \phi_2 + \epsilon) \cdot p \quad (7)$$

wherein $IC_2$ denotes an initialization constant. Subscript 2 in eq. 7 refers to variables/constants of sensor 46.2. $\phi_2$ in equation (7) corresponds to the phase measurement of sensor 46.2 in the X-position as depicted in FIG. 4b (as such, $\phi_2$ may represent a fraction of the period 44.4 of the grating 44). When sensor 46.2 is brought online, $IC_2$ and $N_2$ may have an arbitrary, but known, value (both may, as an example, be set equal to zero). The X-position of the object as depicted in FIG. 4b ($X_2$) can be described by:

$$X_2 = IC_1 + (N_1 + \phi_1 + \epsilon) \cdot p \quad (8)$$

$IC_1$, $N_1$ and $\phi_1$ are known and are related to the X-position as shown in FIG. 4b.

The difference $\Delta$ between the output signal of sensor 46.1 (representing the X-position $X_2$) and the output signal of sensor 46.2 ($X_a$) can therefore be written as:

$$\Delta = X_2 - X_a = (IC_1 - IC_2) + (N_1 - N_2) \cdot p + (\phi_1 - \phi_2) \cdot p + \epsilon'' p \quad (9)$$

Note that Equation 9 introduces an error $\epsilon'' \cdot p$ for the difference $\Delta$ that may be larger than the error error $\epsilon \cdot p$ of the output signals $X_a$ and $X_2$. The standard deviation of the difference $\Delta$ can be represented by $\sigma_\epsilon \cdot \sqrt{2}$, wherein $\sigma_\epsilon$ corresponds to the standard deviation the error $\epsilon \cdot p$ of the output signals $X_a$ and $X_2$ Equation 9 provides a relationship between the variables $N_1$, $N_2$, $\phi_1$ and $\phi_2$ and the initialization constants $IC_1$ and $IC_2$. It may further be observed that, the phase difference $((\phi_1 - \phi_2)$ is substantially constant for a given position and determined by the geometry of the measurement system. As a consequence, a repeated object position can result in the same phase measurements $\phi_1$ and $\phi_2$ and in the same phase difference $(\phi_1 - \phi_2)$.

Figure 4C:
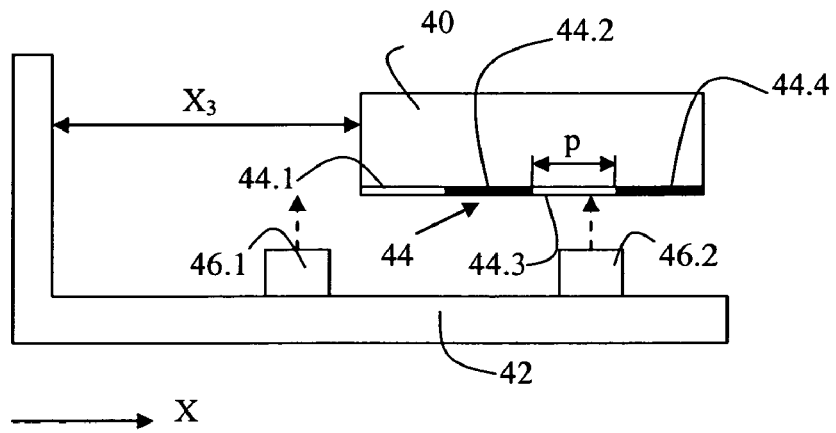

The difference $\Delta$ can be applied to initialize the sensor 46.2 in order for sensor 46.2 to take over the position measurement of the object. This may be obtained by adding the difference $\Delta$ to the output signal $X_a$, e.g., by setting the initialization constant $IC_2$ to the initial value of $IC_2 + \Delta$. (note that this corresponds to the conventional approach as described above). Once sensor 46.2 is initialized, an X-position of the object as indicated in FIG. 4c can be measured using sensor 46.2. Note that in the situation as depicted, sensor 46.1 may not provide an output signal corresponding to the X-position of the object. In case the object is to return subsequently to the position as indicated in FIG. 4b, the conventional approach would be to initialize sensor 46.1 based upon the output signals of sensor 46.2 and sensor 46.1. However, as indicated above, this would lead to an increase in the measurement error.

In the measurement system according to the present invention, a previously established relation between the sensors 46.1 and 46.2 (as described by equation 9) is used to initialize the sensor 46.1 in the following manner (rather than adding the difference $\Delta$ to the output signal $X_a$, e.g., by setting the initialization constant $IC_2$ to the initial value of $IC_2 + \Delta$):

In order to calibrate sensor 46.1 such that its output signal represents the position of the object 40, $IC_1$, $N_1$ and $\phi_1$ are required (see equation 8). Because the phase measurement $\phi_1$ is deterministic, it can be obtained from the measurement system. $IC_1$ can also be considered known from the initial calibration of the sensor 46.1. As such, the only unknown to be determined is $N_1$. According to the present invention, $N_1$ is calculated from the previously established relationship between the sensor parameters (e.g., equation (9)). This calculation may, e.g., be accomplished by rounding off to the nearest integer value. By doing so, the measurement errors can be eliminated, provided that they are smaller than half a period p (which is usually the case). As a result, sensor 46.1 can be calibrated substantially without introducing an additional error. It should be noted that the take over from sensor 46.2 back to sensor 46.1 can be performed in a different position than the position in which the relationship according to equation 9 is determined. Equation 9, in general, provides a relation between $N_1$, $N_2$, $\phi_1$ and $\phi_2$ that can be summarized as:

$$(N_1 - N_2) + (\phi_1 - \phi_2) = C \tag{10}$$

wherein C is a constant.

Equation 10 can, e.g., be applied to determine $N_1$ when $N_2$, $\phi_1$ and $\phi_2$ are known or to determine $N_2$ when $N_1$, $\phi_1$ and $\phi_2$ are known according to the following equations 11a and 11b:

$$N_1 = \text{round}(C + N_2 - (\phi_1 - \phi_2)) \tag{11a}$$

$$N_2 = \text{round}(-C + N_1 + (\phi_1 - \phi_2)) \tag{11b}$$

wherein 'round( )' is used to designate the well-known round off function to the nearest integer.

As such, a subsequent take over from a position measurement using sensor 46.1 to a position measurement using sensor 46.2 can be performed in a similar manner, substantially without introducing an additional measurement error. It will be clear that in case more than two sensors are present, similar relationships can be determined between, e.g., a second sensor and a third sensor in order to perform a take over from a position measurement using the second sensor to a position measurement using the third sensor.

It should be noted that the round-off process may also be applied during the initialization process of the second sensor. This can be illustrated as follows: Assuming the first sensor 46.1 being calibrated at a known object position such that $IC_1$, $N_1$ and $\phi_1$ are known. When sensor 46.2 is brought online, $IC_2$, $N_2$ should be determined. $\phi_2$ is available from measurement of sensor 46.2.

In order to initialize $N_2$, one may set $IC_2$ equal to zero and initialize $N_2$ using equation 11b. When the value of $N_2$, as found is used to generate an output signal, the output signal shall, in general, not correspond to the actual position, due to the round off function that is applied to obtain $N_2$. In order for the output signal to correspond to the actual position, $IC_2$ can be calibrated by equating it to the actual position (e.g., corresponding to the output signal of the first sensor 46.1) minus the output signal of sensor 46.2 (after introduction of the calculated $N_2$).

The measurement system may comprise a control unit for processing the output signals of the sensors of the array of sensors. The control system can be arranged to select and/or process one or more of the output signals in order to generate an output signal suitable for use in e.g. a position controller. When a relationship between the sensor parameters $N_1$, $N_2$, $\phi_1$ and $\phi_2$ is established (see e.g., equations 9 or 10), it can be applied, for example, in the control unit of the measurement system or in a separate unit in order to perform the take over process according to the present invention. The control unit of the measurement system may further be arranged to perform the round off process in order to determine the integer number representing a number of periods traveled from the reference position of the sensor to be initialized.

It should be noted that the take over process according to the present invention may also be applied in a homodyne or a heterodyne interferometer measurement system. Such a measurement system may also require a take over from a position measurement using a first sensor to a position measurement using a second sensor.

Figure 5A:
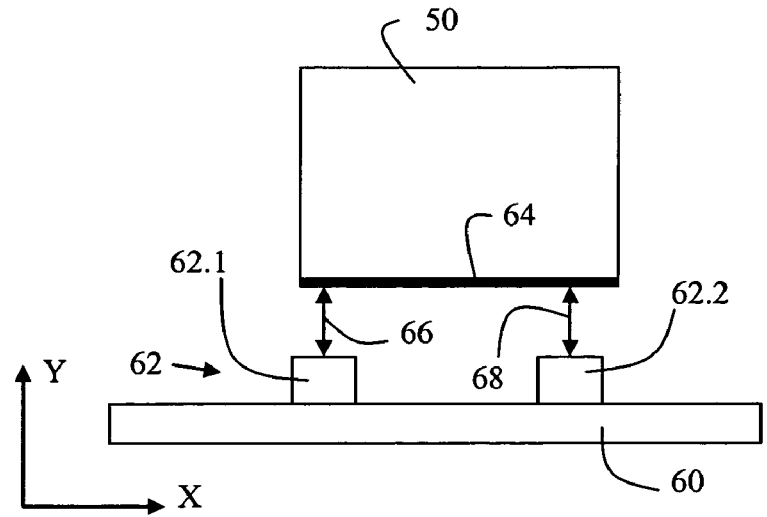
FIGS. 5a-5c schematically depict a take over process in an interferometer system.
Figure 5B:
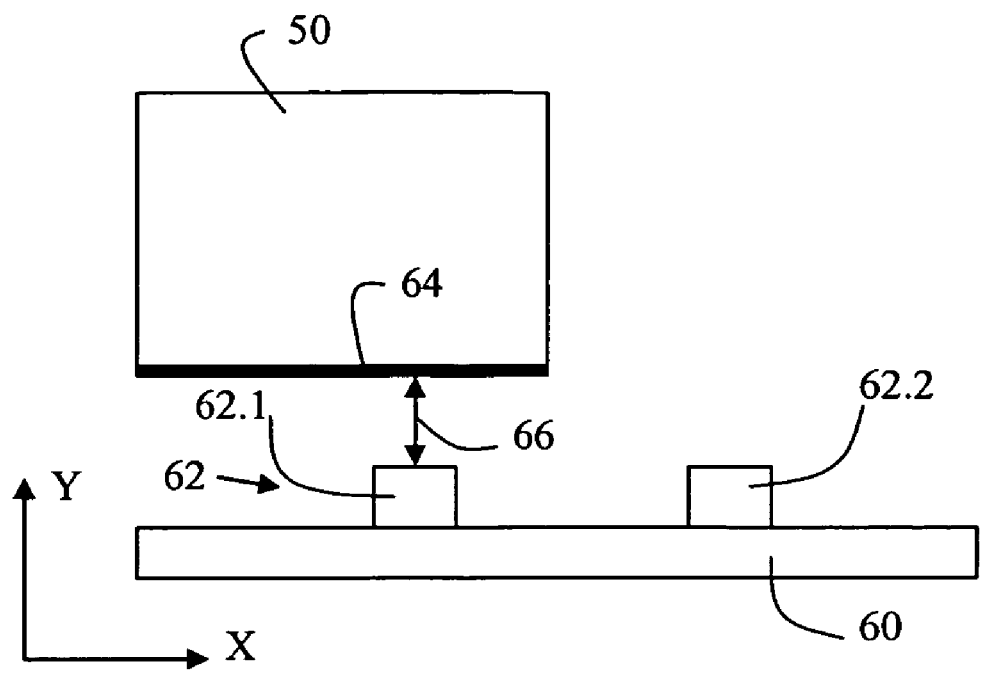
Figure 5C:
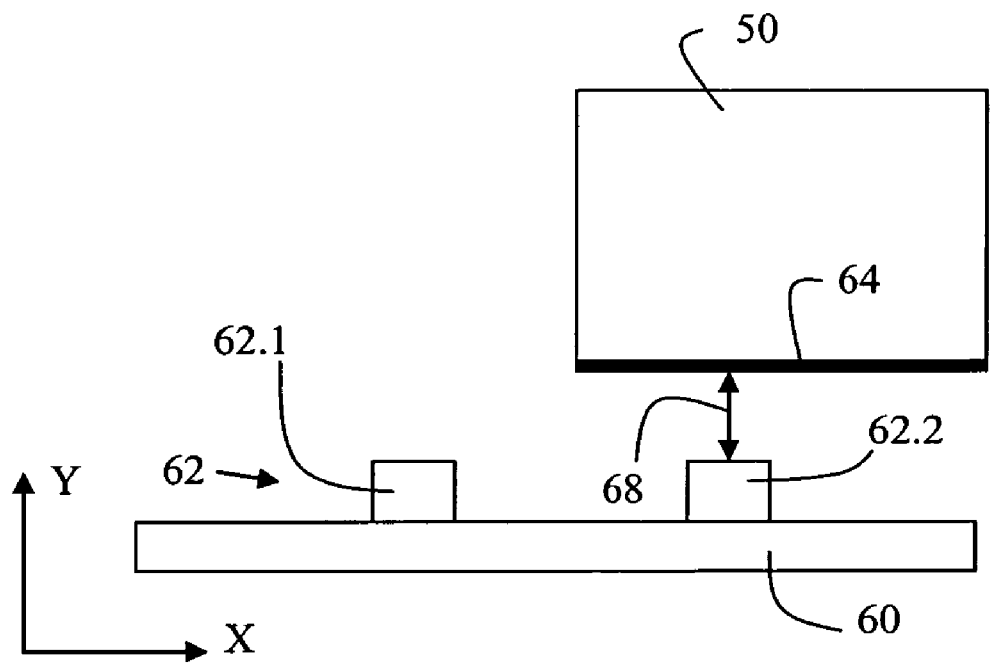

FIG. 5a schematically depicts an interferometer measurement system for measuring the Y-position of an object 50 (e.g., a substrate table of a lithographic apparatus) relative to a reference frame 60. The measurement system comprises an array of sensors 62 comprising a first sensor 62.1 and a second sensor 62.2 mounted on the reference frame 60. A mirror (in general a reflective surface) 64 is mounted to the object 50 in order to reflect laser beams 66 and 68 to the sensors 62.1 and 62.2. The Y-position of the object can be determined by the interferometer measurement system by counting a number of periods (each period corresponding, for example, to a quarter of the wavelength of the laser beam) that is detected and by interpolation within one period. By using an array of sensors, the objects Y-position can be determined over a range of motion in the X-direction that is larger than the length of the mirror in the X-direction. FIGS. 5b and 5c schematically depict two X-positions of the object 50. In the X-position as depicted in FIG. 5b, the Y-position of the object can be determined using sensor

62.1. In the X-position as depicted in FIG. 5c, the Y-position can be determined using sensor 62.2. In order to displace the object from a position as depicted in FIG. 5b to a position as depicted in FIG. 5c while maintaining a Y-position measurement, a take over process according to the present invention between sensors 62.1 and 62.2 can be performed. In case of a heterodyne interferometer system, counting the number of increments and the interpolation to determine the phase can be done relative to a reference signal. In general, both sensors may use the same reference signal or a fixed offset may exist between the reference signals. As such, a relationship between the sensor parameters as described in eq. 10 can be established in order to apply the take over process of the present invention.

It should be noted that the laser beams 66 and 68 may originate from the same laser source or from a different laser source. In the latter case, the Y-measurement performed with sensor 62.1 may have a different period (or increment) than the period of a Y-measurement performed with sensor 62.2.

In general, when a different period is applicable for two sensors, the take over process according to the present invention can be applied in a similar manner. In such an arrangement, the relationship established between the parameters $N_1$, $N_2$, $\phi_1$ and $\phi_2$ (representing the measurement of the phase and the integer number of periods passed of the sensors) may be expanded to include the period $p_1$ of the first sensor and the period $p_2$ of the second sensor. This can be done as follows. Assuming an incremental position measurement system such as an interferometer system or an encoder system (e.g., a Y-measurement) comprising a first (index 1) and a second (index 2) sensor operating with a different period, the output signal $Y_{out\_1}$ of the first sensor and the output signal $Y_{out\_2}$ of the second sensor can be described by:

$$Y_{out\_1} = IC_1 + (N_1 + \phi_1 + \epsilon) \cdot p_1$$

$$Y_{out\_2} = IC_2 + (N_2 + \phi_2 + \epsilon) \cdot p_2 \quad (12)$$

wherein $p_1$, $p_2$=period of the incremental measurement system of the resp. sensors $IC_1$, $IC_2$=initialization constant of the resp. sensors $N_1$, $N_2$=integer representing a number of periods of the resp. sensors $\phi_1$, $\phi_2$=fraction between 0 and 1 representing the interpolation within a period of the resp. sensors $\epsilon$=measurement error.

A difference $\Delta'$ between the output signal of both sensors may take the following form:

$$\Delta' = (IC_1 - IC_2) + (N_1 \cdot p_1 - N_2 \cdot p_2) + (\phi_1 \cdot p_1 - \phi_2 \cdot p_2) + (\epsilon \cdot p_1 - \epsilon \cdot p_2) \quad (13)$$

and can be used to derive the following relationship between the parameters $N_1$, $N_2$, $\phi_1$, $\phi_2$, $p_1$ and $p_2$:

$$(N_1 \cdot p_1 - N_2 \cdot p_2) + (\phi_1 \cdot p_1 - \phi_2 \cdot p_2) = C' \quad (14)$$

wherein $C'$ is a constant.

Note that, regarding the error as indicated in eq. 13, the considerations as made for eq. 9 are valid, i.e., the standard deviation of the difference $\Delta'$ may be larger than the standard deviation of the output signals of eq. 12. Equation 14 can be applied to determine $N_1$ when $N_2$, $\phi_1$ and $\phi_2$ are known or to determine $N_2$ when $N_1$, $\phi_1$ and $\phi_2$ are known according to the following equations 15a and 15b:

$$N_1 = \text{round}\left(\frac{C + N_2 \cdot p_2 - (\varphi_1 \cdot p_1 - \varphi_2 \cdot p_2)}{p_1}\right) \quad (15a)$$

$$N_2 = \text{round}\left(\frac{-C + N_1 \cdot p_1 - (\varphi_1 \cdot p_1 - \varphi_2 \cdot p_2)}{p_2}\right) \quad (15b)$$

wherein 'round( )' is used to designate the well-known round off function to the nearest integer.

Using equations 15a and 15b, the take over process as used in the present invention can be perform when the sensors involved are operating with a different period.

Figure 6A:
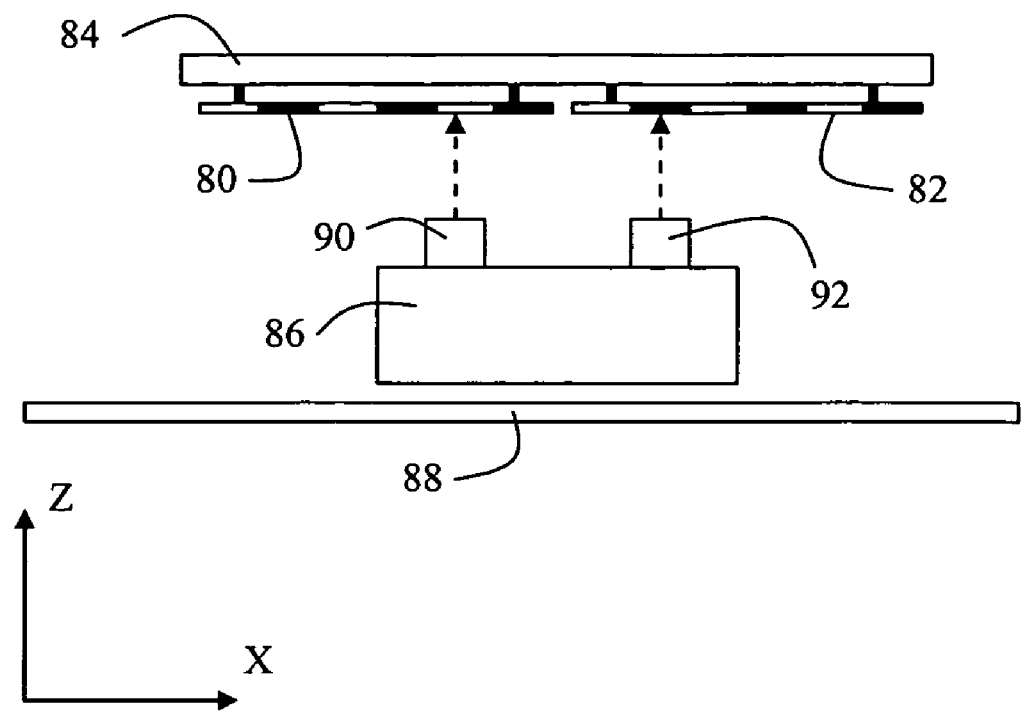
FIGS. 6a-6e schematically depict a take over process in a measurement system comprising multiple gratings and multiple sensors.
Figure 6B:
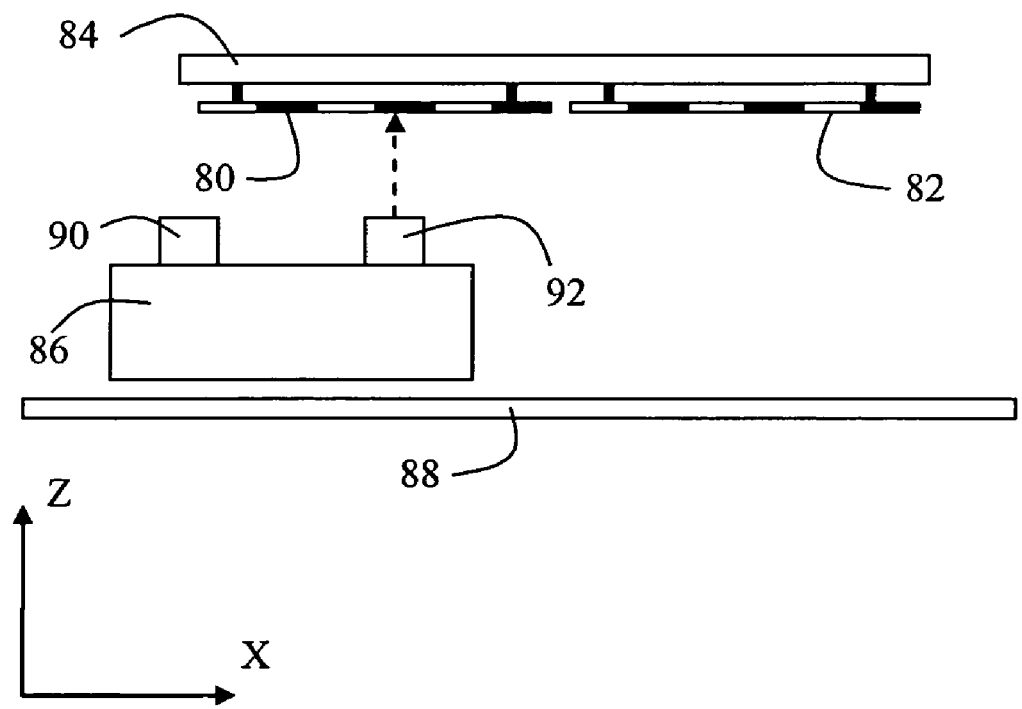
Figure 6C:
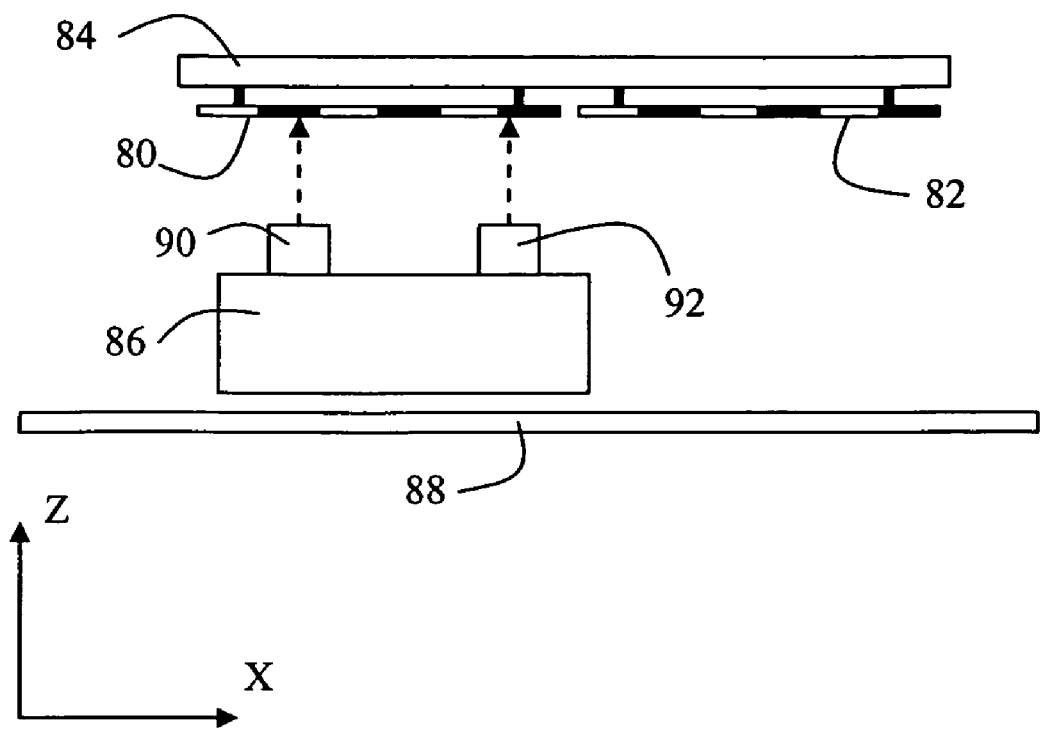
Figure 6D:
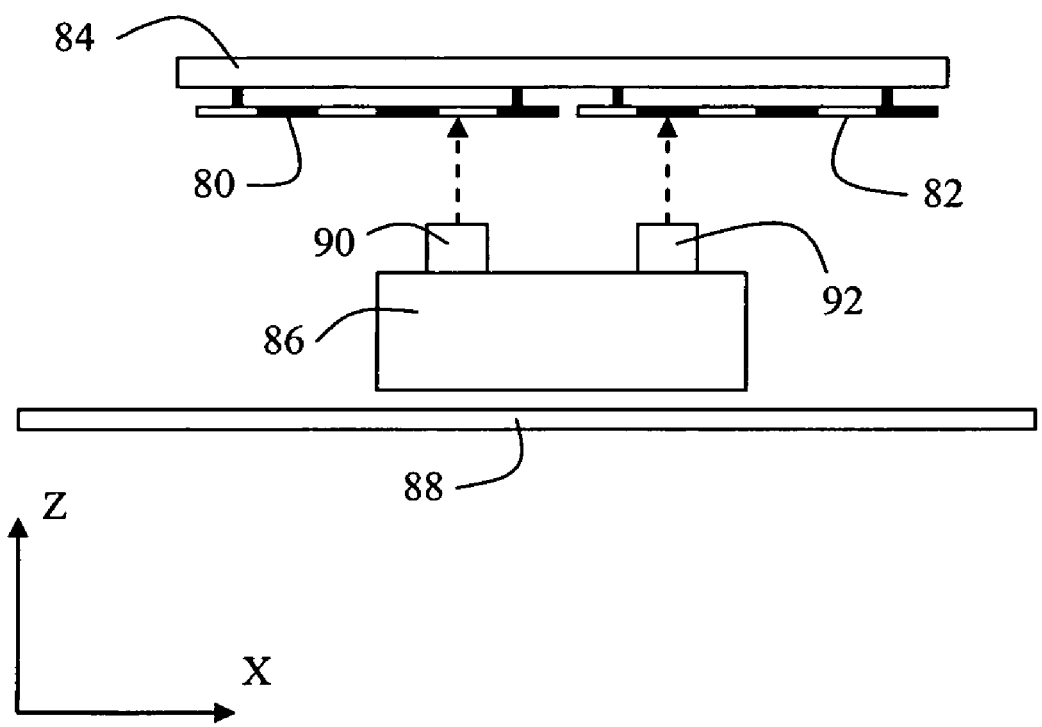
Figure 6E:
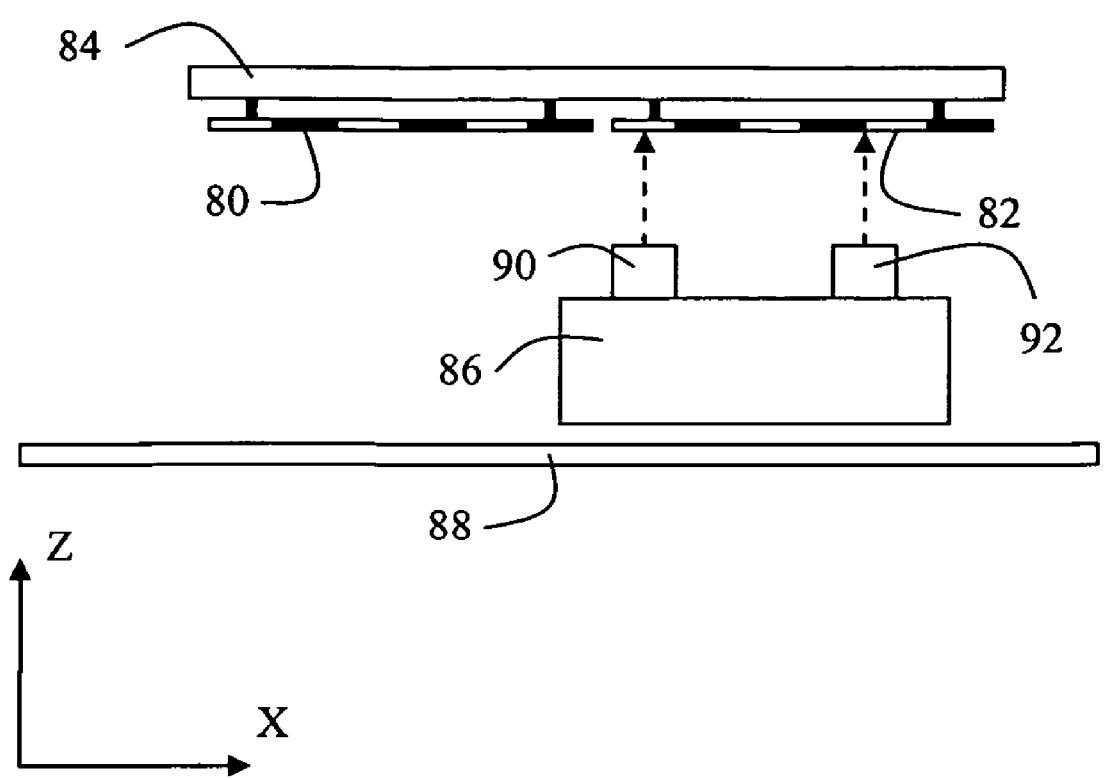

The take over process according to the present invention may also be applied in a measurement system comprising multiple gratings and multiple sensors. FIG. 6a schematically depicts such an arrangement comprising two gratings 80, 82 mounted to a reference frame 84, an object 86 displaceable along the X-direction relative to a frame 88 and two sensors 90, 92 arranged to co-operate with the gratings 80, 82, the two sensors being arranged adjacent to each other in the X-direction and mounted to the object 86. In such an arrangement, the take over process as applied in the present invention can be applied in order transfer from a position measurement using the first grating to a position measurement using the second grating. Departing from an initial position as depicted in FIG. 6b wherein the position measurement is performed by sensor 92 in co-operation with the grating 80, the object may be displaced to a position as depicted in FIG. 6c. In case the object is to be displaced to a position as depicted in FIG. 6d the position measurement should first be taken over by the sensor 90 co-operating with grating 80. This can be done using the take over process applied in the present invention and explained in FIG. 4b. Once the position measurement is taken over by sensor 90 co-operating with grating 80, the object 86 can displace to the position as indicated in FIG. 6d. In the position as depicted in FIG. 6d the position measurement by sensor 90 in co-operation with grating 80 can be changed to a position measurement by sensor 92 in co-operation with grating 82 by a take over process as applied in the present invention. Note that grating 82 may have a period that is different from the period of grating 80. Once the position measurement by sensor 92 in co-operation with grating 82 is established, the object may, e.g., displace to a position as indicated in FIG. 6e.

It should be noted that the described invention may also be applied to monitor certain drift components in the measurement system such as the distance from sensor to sensor or the length of the grating. The take over process according to the present invention applies a previously established relationship between parameters obtained from different sensors (see e.g., eq. 10 or 14). This relationship can, e.g., be established during calibration of the measurement system. In case of a relative slowly drifting measurement system, the relationship between the sensor parameters may change over time. This change can be monitored because the relationship between the sensor parameters can be determined each time a take over process is performed resulting in a actualized value of C. Comparing the actualized value to the initially established value provides information on the drift of the measurement system over time. By monitoring C as a function of time and correcting for it, the take over process according to the present invention can also be applied in relative slow drifting systems.

It should be noted that the present invention may equally be applied in a measurement system arranged to measure a position in more than one degree of freedom. As an example, the present invention can be applied in a 2D encoder measurement system. Such a system may comprise a plurality of sensors constructed and arranged to co-operate with a two-dimensional grating in order to determine the position of an object in both X-direction and Y-direction. In order to perform the take over process according to the present invention, a relationship as described in eq. 9 or 10 can be established for both directions.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A position measurement system for measuring a position of an object, the position measurement system comprising:
a first incremental measurement unit configured to measure a first number of first distance steps in a distance between a reference frame and the object, wherein the first number equals a first integer value plus a first fraction,
a second incremental measurement unit configured to measure a second number of second distance steps in a distance between the reference frame and the object, wherein the second number equals a second integer value plus a second fraction,
wherein the position measurement system is constructed and arranged to initialize the second incremental measurement unit on the basis of the first number and the second fraction.

2. A position measurement system according to claim 1, wherein during initialization of the second incremental measurement unit, the second integer value is determined on the basis of a predetermined relationship between the first integer value, the first fraction, the second integer value and the second fraction.

3. A position measurement system according to claim 1, wherein the position measurement system is constructed and arranged to calibrate the second incremental measurement unit on the basis of a position measurement by the first incremental measurement unit.

4. A position measurement system according to claim 2, wherein an output signal of the first incremental measurement unit $X_{out1}$ substantially equals $$X_{out1} = IC_1 + (N_1 + \phi_1 + \epsilon_1) \cdot p_1$$

wherein:
$p_1$ = a size of the first distance step
$IC_1$ = an initialization constant
$N_1$ = the first integer value
$\phi_1$ = the first fraction,
$\epsilon_1$ = a measurement error,
and wherein an output signal of the second incremental measurement unit $X_{out2}$ substantially equals $$X_{out2} = IC_2 + (N_2 + \phi_2 + \epsilon_2) \cdot p_2$$

wherein:
$p_2$ = a size of the second distance step
$IC_2$ = an initialization constant
$N_2$ = the second integer value
$\phi_2$ = the second fraction,
$\epsilon_2$ = a measurement error.

5. A position measurement system according to claim 4 wherein the predetermined relationship or the calibration is obtained by equating the output signal $X_{out1}$ of the first incremental measurement unit at a measurement position to the output signal $X_{out2}$ of the second incremental measurement unit at the measurement position.

6. A position measurement system according to claim 4 wherein the predetermined relationship is obtained by
calibrating the first incremental measurement unit at a first measurement position thereby initializing $IC_1$ and $N_1$,
initializing the second incremental measurement unit at a second measurement position such that the output signal $X_{out2}$ of the second incremental measurement unit at the second measurement position corresponds to the output signal $X_{out1}$ of the first incremental measurement unit at the first measurement position, thereby initializing $IC_2$.

7. A position measurement system according to claim 4, wherein the initialization of the second incremental measurement unit comprises equating the second integer value $N_2$ by a round off operation.

8. A position measurement system according to claim 1, wherein the first incremental measurement unit comprises a grating and a first encoder head constructed and arranged to co-operate with the grating, wherein the second incremental measurement unit comprises a second encoder head constructed and arranged to co-operate with the grating and wherein the first distance step is a function of a pitch of the grating.

9. A position measurement system according to claim 8, wherein the grating is mounted to the reference frame and the first and second encoder heads are mounted to the object.

10. A position measurement system according to claim 8, wherein the grating is mounted to the object and the first and second encoder heads are mounted to the reference frame.

11. A position measurement system according to claim 8, wherein the second incremental measurement unit comprises a further grating constructed and arranged to co-operate with the first encoder head or with the second encoder head.

12. A position measurement system according to claim 1, wherein the first incremental measurement unit comprises a reflective surface constructed and arranged to reflect a radiation beam of an interferometer of the position measurement system to a first optical sensor of the first incremental measurement unit or to a second optical sensor of the second incremental measurement unit and wherein the first distance step is a function of a wavelength of the radiation beam.

13. A position measurement system according to claim 12, wherein the reflective surface is mounted to the object and the optical sensors are mounted to the reference frame.

14. A position measurement system according to claim 12, wherein the reflective surface is mounted to the reference frame and the optical sensors are mounted to the object.

15. A position measurement system according to claim 12, wherein the second incremental measurement unit comprises a further reflective surface constructed and arranged to reflect a radiation beam of the interferometer of the position measurement system to the first optical sensor or the second optical sensor.

16. A position measurement system according to claim 1, wherein the position measurement system is constructed and arranged to initialize the first incremental measurement unit on the basis of the second number and the first fraction.

17. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a position measurement system for measuring a position of the support or the substrate table, the position measurement system comprising:
      a first incremental measurement unit configured to measure a first number of first distance steps in a distance between a reference frame and the support or the substrate table, wherein the first number equals a first integer value plus a first fraction,
      a second incremental measurement unit configured to measure a second number of second distance steps in a distance between the reference frame and the support or the substrate table, wherein the second number equals a second integer value plus a second fraction,
      wherein the position measurement system is constructed and arranged to initialize the second incremental measurement unit on the basis of the first number and the second fraction.

18. A lithographic apparatus according to claim 17, wherein during initialization of the second incremental measurement unit, the second integer value is determined on the basis of a predetermined relationship between the first integer value, the first fraction, the second integer value and the second fraction.

19. A lithographic apparatus according to claim 17, wherein the position measurement system is constructed and arranged to calibrate the second incremental measurement unit on the basis of a position measurement by the first incremental measurement unit.

20. A lithographic apparatus according to claim 17, wherein the first incremental measurement unit comprises a grating and a first encoder head constructed and arranged to co-operate with the grating, wherein the second incremental measurement unit comprises a second encoder head constructed and arranged to co-operate with the grating and wherein the first distance step is a function of a pitch of the grating.

21. A lithographic apparatus according to claim 17, wherein the first incremental measurment unit comprises a reflective surface constructed and arranged to reflect a radiation beam of an interferometer of the position measurement system to a first optical sensor of the first incremental measurement unit or to a second optical sensor of the second incremental measurement unit and wherein the first distance step is a function of a wavelength of the radiation beam.

22. A lithographic apparatus according to claim 17, wherein the position measurement system is constructed and arranged to initialize the first incremental measurement unit on the basis of the second number and the first fraction.

* * * * *